United States Patent
Avraham et al.

(10) Patent No.: US 11,709,621 B2
(45) Date of Patent: Jul. 25, 2023

(54) READ THRESHOLD MANAGEMENT AND CALIBRATION

(71) Applicant: Western Digital Technologies, Inc., San Jose, CA (US)

(72) Inventors: Dudy Avraham, Even Yehuda (IL); Alex Bazarsky, Holon (IL); Evgeny Mekhanik, Rehovot (IL)

(73) Assignee: Western Digital Technologies Inc., San Jose, CA (US)

( * ) Notice: Subject to any disclaimer, the term of this patent is extended or adjusted under 35 U.S.C. 154(b) by 119 days.

(21) Appl. No.: 17/230,392

(22) Filed: Apr. 14, 2021

(65) Prior Publication Data

US 2022/0113894 A1    Apr. 14, 2022

Related U.S. Application Data

(60) Provisional application No. 63/089,757, filed on Oct. 9, 2020.

(51) Int. Cl.
*G06F 3/06* (2006.01)
*G11C 29/02* (2006.01)

(52) U.S. Cl.
CPC .......... *G06F 3/0655* (2013.01); *G06F 3/0604* (2013.01); *G06F 3/0679* (2013.01); *G11C 29/021* (2013.01); *G11C 29/028* (2013.01)

(58) Field of Classification Search
CPC .... G06F 3/0655; G06F 3/0604; G06F 3/0679; G11C 29/021; G11C 29/028
See application file for complete search history.

(56) References Cited

U.S. PATENT DOCUMENTS

| | | | |
|---|---|---|---|
| 9,141,475 B2 | 9/2015 | Alrod et al. | |
| 9,442,662 B2 | 9/2016 | Dancho et al. | |
| 9,697,905 B2 | 7/2017 | Sharon et al. | |
| 2013/0343131 A1 | 12/2013 | Wu et al. | |
| 2017/0271031 A1* | 9/2017 | Sharon | G11C 29/52 |
| 2018/0373437 A1 | 12/2018 | Navon et al. | |
| 2020/0105353 A1 | 4/2020 | Sharon et al. | |
| 2021/0407613 A1* | 12/2021 | Eliash | G11C 29/14 |

FOREIGN PATENT DOCUMENTS

| | | |
|---|---|---|
| KR | 20190043022 A | 4/2019 |
| KR | 20190062160 A | 6/2019 |

* cited by examiner

*Primary Examiner* — Kyle Vallecillo
(74) *Attorney, Agent, or Firm* — Dickinson Wright PLLC; Steven C. Hurles

(57) ABSTRACT

A system and method for read threshold calibration in a non-volatile memory are provided. Physical dies in the memory are divided into groups based on device-level parameters such as time and temperature parameters. An outlier die may be identified outside of the plurality of groups based on a comparison of a bit error rate (BER) indicator for each die to a threshold. For each group of dies, a read parameter is determined for at least one die, and applied to each of the plurality of dies of the group. The read parameter may be determined based on a threshold measurement of a representative one or more word lines.

7 Claims, 14 Drawing Sheets

READ THRESHOLD MANAGEMENT AND CALIBRATION

CROSS-REFERENCE TO RELATED APPLICATION

This utility application claims the benefit of U.S. Provisional Application No. 63/089,757 filed Oct. 9, 2020, titled "READ THRESHOLD MANAGEMENT AND CALIBRATION". The provisional application is incorporated by reference herein as if reproduced in full below.

BACKGROUND

1. Field

Apparatuses and methods consistent with exemplary embodiments relate to read threshold calibration, and more specifically to read threshold calibration of a non-volatile memory comprising one or more groups of physical dies.

2. Description of the Related Art

One challenge introduced by Not-And (NAND) process shrinking and three-dimensional (3D) stacking is maintaining process uniformity. A lack of process uniformity leads to increased variability among memory dies, blocks, and pages and also across different endurance, retention, temperature and disturbance conditions, for example. Operation under such diverse conditions requires using an adaptive system, especially in terms of tracking optimal read thresholds in order to ensure that the read throughput and input/output operations per second (IOPS) requirements are met and to ensure Quality of Service (QoS).

Read threshold calibration can be conducted through a process of applying a number of senses and then sequentially calculating a Syndrome Weight (SW) as an estimate of the bit error rate (BER) according to different hypotheses related to the number of senses. This process may sometimes be referred to as a BER Estimation Scan (BES).

Alternately, according to a related-art method, valleys in a Cell Voltage Distribution (CVD) can be determined, measuring the difference of conducting cells between different voltage points.

In both methods, sampling is done on one specific logical\physical page, and thus must be performed sequentially, in that, while the order of sampling is not significant, it requires full coverage.

One solution for this problem is using time tags (TT) & temperature tags (e.g. thermal regional Tag (TRT)) to group together blocks that were programmed roughly at the same time and the same temperature. Assuming that a controller implements a wear leveling mechanism, then all blocks are expected to have roughly the same program/erase (P/E) count (PEC). Thus, all blocks within a TT and/or TRT group are expected to have similar optimal read thresholds because they have roughly the same PEC and were programmed at roughly the same time and temperature. This allows a controller to maintain a set of read thresholds per TT/TRT group, instead of per block, word line (WL), or page. Conventionally, the number of TT/TRT groups will be small (e.g., approximately 32) and a large number of blocks will be associated to each TT/TRT group. Hence, there is a large savings in the memory required for managing the read thresholds and in the maintenance operations required for keeping updated read thresholds.

SUMMARY

Example embodiments may address any problems and/or disadvantages and other disadvantages not described above. Also, example embodiments are not required to overcome the disadvantages described above, and may not overcome any of the problems described above.

One or more example embodiments may provide a method of read threshold management of a non-volatile memory comprising a group of a plurality of physical dies, each of the plurality of physical dies comprising a plurality of physical blocks, the method comprising: determining an optimal read parameter of at least one selected physical die of the plurality of physical dies and defining the optimal read parameter as a compound read parameter; and applying the compound read parameter to each of the plurality of physical dies of the group.

The determining the optimal read parameter may comprise determining a first optimal read parameter of a first selected physical die, determining a second optimal read parameter of a second selected physical die, and defining the optimal read parameter as an average of at least the first optimal read parameter and the second optimal read parameter.

The determining the optimal read parameter may comprise determining at least one device level parameter of the at least one physical die and determining the optimal read parameter based on the at least one device level parameter.

The determining the optimal read parameter may comprise determining a first device level parameter of a first word line, determining a second device level parameter of a second word line; and determining the optimal read parameter based on the first device level parameter and the second device level parameter.

The method may also comprise performing a bit error rate (BER) estimation scan (BES) on each of the plurality of physical dies.

The performing the BES may comprise calculating a syndrome weight as an estimate of the BER.

The read threshold optimization may comprise performing a valley search.

One or more example embodiments may provide a method of identifying an outlier die of a plurality of physical dies of a non-volatile memory, the method comprising: for each of the plurality of physical dies, determining an identifier, wherein the identifier is an identifier of a bit error rate (BER); for each of the plurality of physical dies, comparing the identifier against a predetermined statistic; and identifying if each of the plurality of physical dies is an outlier die based on the comparing.

The identifier may comprise a mean BER; the determining the identifier may comprise performing a plurality of BER measurements and obtaining a mean of the plurality of BER measurements; and the comparing may comprise comparing the mean of the plurality of BER measurements to a threshold.

The identifier may comprise a mean BER; and the determining and the comparing may comprise: performing a first plurality of BER measurements and obtaining a mean of the first plurality of BER measurements, comparing the mean of the first plurality of BER measurements to a threshold; performing a second plurality of BER measurements and obtaining a mean of the second plurality of BER measurements, wherein a number of the second plurality of BER measurements is greater than a number of the first plurality of BER measurements, and comparing the mean of the second plurality of BER measurements to the threshold.

The threshold may be a mean BER of all of the plurality of physical dies, and the identifying if each of the plurality of dies is an outlier die may comprise: for each of the plurality of physical dies: if the mean BER of the die is greater than two sigma different from the mean BER of all of the plurality of physical dies, identifying the die as an outlier die.

One or more example embodiments may provide a non-volatile memory system comprising: a non-volatile memory comprising a group of a plurality of physical dies; and a controller circuit; wherein the controller circuit is configured to transmit an instruction to each individual die of the plurality of physical dies to perform a read threshold calibration; and wherein each individual physical die is configured to receive the instruction and perform the read threshold calibration comprising one of: performing the read threshold calibration of a single threshold, different from any threshold calibrated by any other of the plurality of physical dies, and performing the read threshold calibration on a single logical page, different from any logical page calibrated by any other of the plurality of physical dies; and wherein the controller circuit is further configured to determine an updated read threshold for all of the plurality of physical dies based on results of the performing the read threshold calibration of each individual physical die.

Each individual physical die of the plurality of dies calibrating the threshold may comprise performing the read threshold calibration when there is a command queue vacancy.

BRIEF DESCRIPTION OF THE DRAWINGS

The above and/or other aspects will become apparent and more readily appreciated from the following description of example embodiments, taken in conjunction with the accompanying drawings in which.

DETAILED DESCRIPTION

Figure 1:
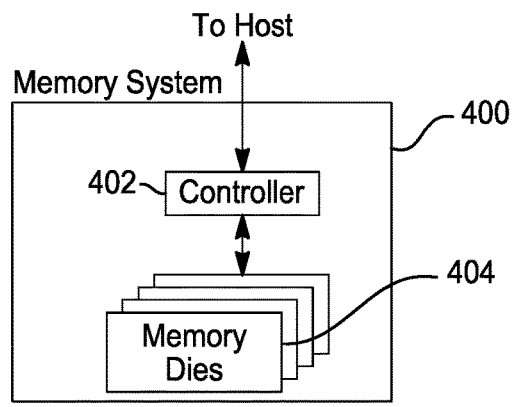
FIG. 1 illustrates a block diagram of a memory system 400 according to an example embodiment.

Reference will now be made in detail to example embodiments which are illustrated in the accompanying drawings, wherein like reference numerals refer to like elements throughout. In this regard, the example embodiments may have different forms and should not be construed as being limited to the descriptions set forth herein.

It will be understood that the terms "include," "including", "comprise," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "and/or" includes any and all combinations of one or more of the associated listed items. Expressions such as "at least one of," when preceding a list of elements, modify the entire list of elements and do not modify the individual elements of the list. In addition, the terms such as "unit," "-er (-or)," and "module" described in the specification refer to an element for performing at least one function or operation, and may be implemented in hardware, software, or the combination of hardware and software.

Memory System

FIG. 1 illustrates a block diagram of a memory system 400 according to an example embodiment which may perform the methods as described herein. The memory system 400 includes the controller 402 and memory that includes one or more memory dies 404. As used herein, the term die refers to the set of memory cells, and associated circuitry for managing the physical operation of those memory cells, that are formed on a single semiconductor substrate. The controller 402 may interface with a host system and transmit command sequences for read, program, and erase operations NAND memory dies 404.

The controller 402, which is a flash memory controller, can take the form of any one of processing circuitry, a microprocessor or processor, and a computer-readable medium that stores computer-readable program code (e.g., software or firmware) executable by the (micro)processor, logic gates, switches, an application specific integrated circuit (ASIC), a programmable logic controller, and an embedded microcontroller, for example. The controller 402 can be configured with hardware and/or firmware to perform the various functions described herein and generally illustrated in the timing diagrams. For example, the controller can control read threshold levels in the non-volatile memory.

Figure 4:
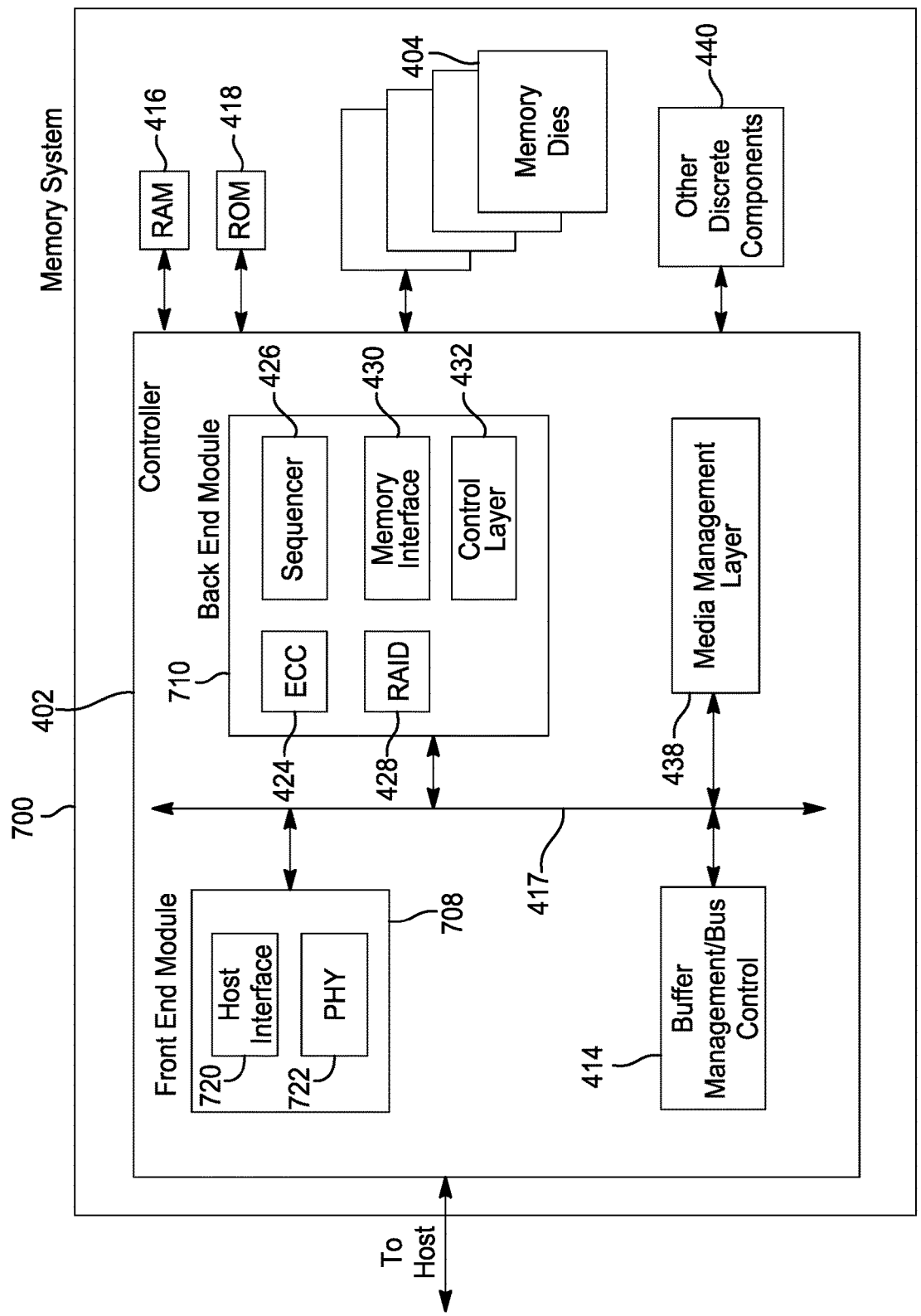
FIG. 4 illustrates a block diagram of a configuration of components of a controller of the memory system of FIG. 1, according to an example embodiment.

Any one or more of the components shown and discussed with respect to FIG. 4, as being internal to the controller 402 may additionally or alternatively be external to the controller

402, and other components may be included. It is noted that any component described as "in communication with" may be directly in communication with or indirectly (wired or wireless) in communication with, via one or more intermediary components, which may or may not be generally illustrated or described herein.

As used herein, the controller 402 is a device that manages data stored in the memory dies and is in communication with the host, such as a computer or electronic device. The controller 402 may have any of various additional functionalities in addition to the specific functionality described herein. For example, the controller 402 may format the memory dies 404 to ensure they operating properly, may map out bad flash memory cells, and may allocate spare cells to be substituted for future failed cells. Some part of the spare cells may be used to hold firmware to operate the controller 402 and implement other features. In operation, when the host needs to read data from or write data to the memory die(s) 404, the host will communicate with the controller 402. If the host provides a logical address to which data is to be read/written, the controller 402 can convert the logical address received from the host to a physical address in the memory die(s) 404. Alternately, the host may also provide the physical address. The controller 402 may also perform various memory management functions, such as, but not limited to, wear leveling (the distribution of writes to avoid wearing out specific blocks of memory that would otherwise be repeatedly written to) and garbage collection (a process of only the valid pages of data of a full block to a new block, so the full block can be erased and reused). The controller 402 may also control the methods and operations described hereinbelow.

The interface between the controller 402 and the non-volatile memory die(s) 404 may be any suitable interface, such as flash interface. The memory system 400 may be a card-based system, such as a secure digital (SD) or a micro secure digital (micro-SD) card. Alternately, the memory system 400 may be part of an embedded memory system.

As shown in FIG. 4, the memory system 400 is illustrated as including a single channel between the controller 402 and the non-volatile memory die(s) 404. However, this is not intended to be limiting, and the memory system may include more than a single channel, such as a memory system embodying a NAND architecture and including two, four, eight, or more channels between the controller 402 and the memory die(s) 404. In anyone or more of the example embodiments described herein, multiple channels may exist between the controller 402 and the memory die(s) 404, even if a single channel is illustrated.

Figure 2:
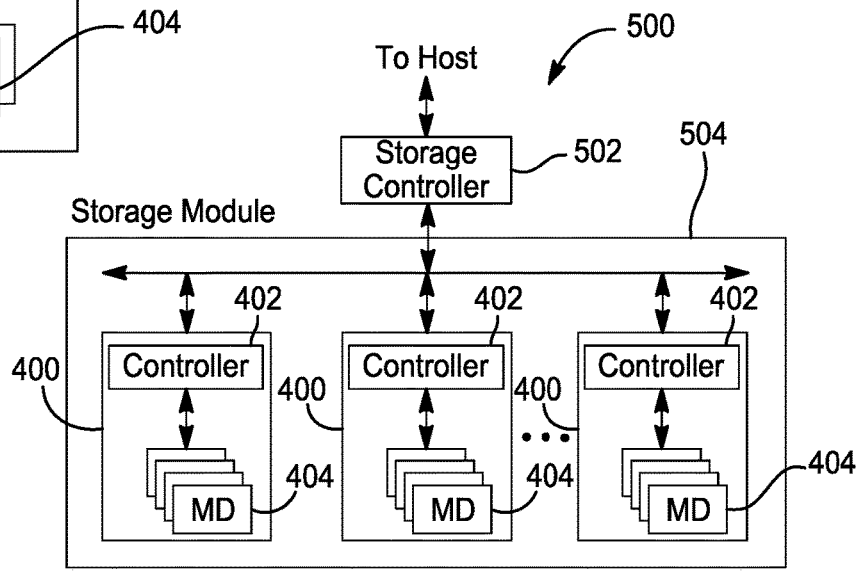
FIG. 2 illustrates a block diagram of a storage module including a plurality of memory systems according to an example embodiment.

FIG. 2 illustrates a block diagram of a storage module 500 including a plurality of memory systems according to an example embodiment. As such, the storage module 500 includes a storage controller 502 that interfaces with the host and with a storage system 504, which includes a plurality of non-volatile memory systems 400. The interface between the storage controller 502 and non-volatile memory systems 400 may be a bus interface, such as a serial advanced technology attachment (SATA), a peripheral component interface express (PCIe) interface, an embedded Multimedia Card (eMMC) interface, an SD interface, or a Universal Serial Bus (USB) interface, for example. The storage module 500 may be a solid-state drive (SSD), such as found in portable computing devices, such as laptop and tablet computers and mobile phones.

Figure 3:
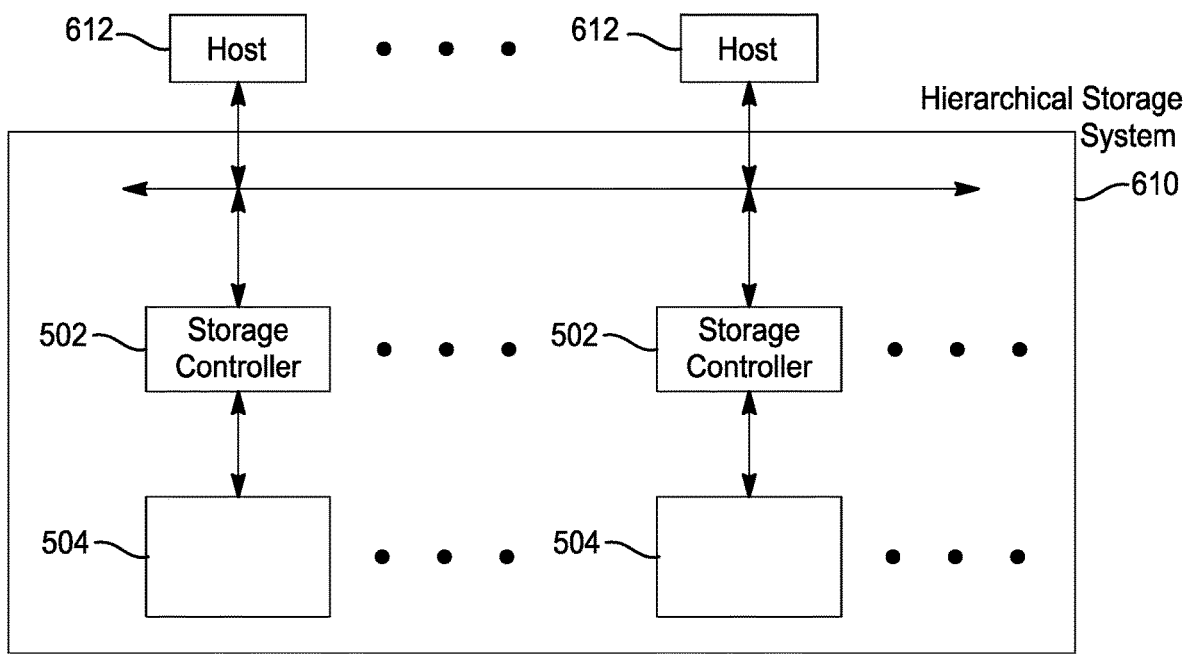
FIG. 3 illustrates a block diagram of a hierarchical storage system according to an example embodiment.

FIG. 3 illustrates a block diagram of a hierarchical storage system 610 according to an example embodiment. The hierarchical storage system 610 includes a plurality of storage controllers 502, each of which controls control a respective storage system 504. Host systems 612 may access memories within the hierarchical storage system 610 via a bus interface. Example bus interfaces may include a non-volatile memory express (NVMe), a fiber channel over Ethernet (FCoE) interface, an SD interface, a USB interface, a SATA interface, a PCIe interface, or an eMMC interface, for example. The storage system 610 may be a rack-mountable mass storage system that is accessible by multiple host computers, such as would be found in a data center or other location where mass storage is needed.

FIG. 4 illustrates a block diagram of a configuration of components of a controller 402 of the memory system of FIG. 1, according to an example embodiment. The controller 402 may include a front end module 708 that interfaces with the host, a back end module 710 that interfaces with the non-volatile memory die(s) 404, and various other modules that perform various functions of the non-volatile memory system 700. A module may be hardware or a combination of hardware and software. For example, each module may include an application specific integrated circuit (ASIC), a field programmable gate array (FPGA), a circuit, a digital logic circuit, an analog circuit, a combination of discrete circuits, gates, or any other type of hardware or any combination thereof. In addition or alternately, each module may include memory hardware that comprises instructions executable with a processor or processor circuitry to implement one or more of the features of the module. When any one of the modules includes the portion of the memory that comprises instructions executable with the processor, the module may or may not include the processor In some instances, each module may simply be the portion of the memory that comprises instructions executable with the processor to implement the features of the corresponding module without the module including any other hardware. Because each module includes at least some hardware even when the included hardware includes software, each module may be referred to as a hardware module.

The controller 402 may include a buffer manager/bus controller module 414 that manages buffers in random access memory (RAM) 416 and controls the internal bus arbitration for communication on an internal communications bus 417 of the controller 402. A read only memory (ROM) 418 may store and/or access system boot code. Although illustrated as located separately from the controller 402, one or both of the RAM 416 and the ROM 418 may be located within the controller 402. According to one or more example embodiments, portions of RAM 416 and ROM 418 may be located both within the controller 402 and outside the controller 402. According to one or more example embodiments, the controller 402, the RAM 416, and the ROM 418 may be located on separate semiconductor dies.

The front-end module 708 may include a host interface 720 and a physical layer interface (PHY) 722 that provide the electrical interface with the host or next level storage controller. The type of the host interface 720 can depend on the type of memory being used. Example types of the host interface 720 may include, but are not limited to, SATA, SATA Express, SAS, Fibre Channel, USB, PCIe, and NVMe. The host interface 720 may facilitate transfer for data, control signals, and timing signals.

The back-end module 710 may include an error correction code (ECC) engine or module 424 that encodes the data bytes received from the host, and decodes and error corrects the data bytes read from the non-volatile memory die(s) 404. The back end module 710 may also include a command sequencer 426 that generates command sequences, such as program, read, and erase command sequences, to be transmitted to the non-volatile memory die(s) 404. The back end module 710 may include a RAID (Redundant Array of Independent Drives) module 728 that manages generation of RAID parity and recovery of failed data. The RAID parity may be used as an additional level of integrity protection for the data being written into the non-volatile memory system 700. The RAID module 428 may be a part of the ECC engine 424. A memory interface 430 provides command sequences to the non-volatile memory die(s) 404 and receives status information from the non-volatile memory die(s) 404. Along with the command sequences and status information, data to be programmed into and read from the non-volatile memory die(s) 404 may be communicated through the memory interface 430. According to one or more example embodiments, the memory interface 430 may be a double data rate (DDR) interface and/or a Toggle Mode 200, 400, 800, or higher interface. A control layer 432 may control the overall operation of back end module 710.

Additional modules of the non-volatile memory system 700 may include a media management layer 438 that performs certain memory management functions such as wear leveling of memory cells of the memory dies 404, address management, and facilitation of folding operations. The non-volatile memory system 400 may also include other discrete components 440, such as external electrical interfaces, external RAM, resistors, capacitors, or other components that may interface with the controller 402. According to one or more example embodiments, one or more of the RAID module 428, the media management layer 438, and the buffer management/bus controller 414 are optional components that may be omitted.

Figure 5:
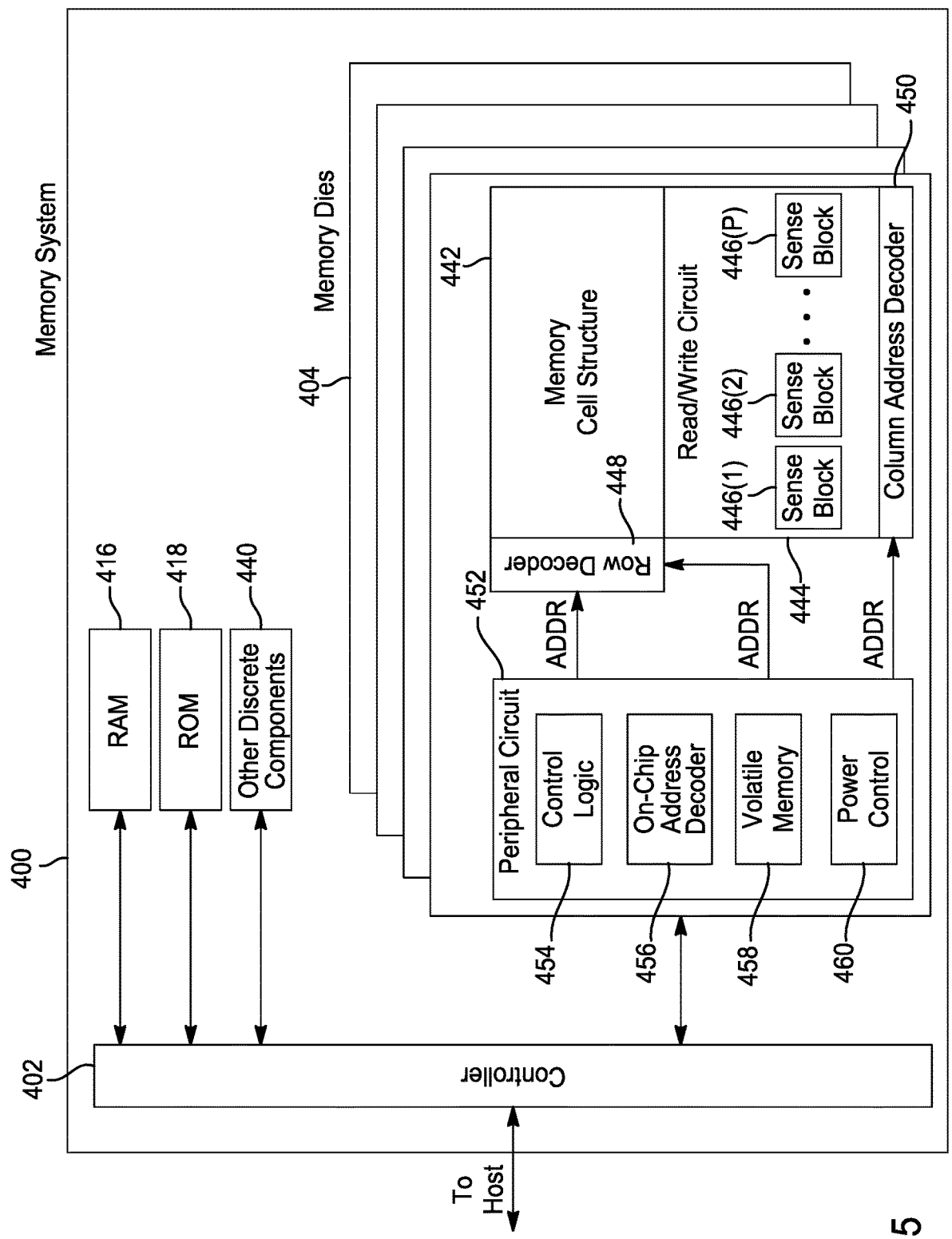
FIG. 5 illustrates a block diagram of a configuration of components of a memory die 404 of the memory system of FIG. 4 according to an example embodiment.

FIG. 5 illustrates a block diagram of a configuration of components of a memory die 404 of the memory system of FIG. 4 according to an example embodiment. The memory die 404 includes a memory cell structure 442 that includes a plurality of memory cells, interchangeably referred to as memory elements. A memory cell is an element or component that stores a unit of data having an n-bit data value, where n is on or more. Any suitable type of memory can be used for the memory cells of the memory cell structure 442. As examples, the memory can be dynamic random access memory ("DRAM") or static random access memory ("SRAM"), non-volatile memory, such as resistive random access memory ("ReRAM"), electrically erasable programmable read only memory ("EEPROM"), flash memory (which can also be considered a subset of EEPROM), ferroelectric random access memory ("FRAM"), magnetoresistive random access memory ("MRAM"), phase-change memory ("PCM"), or other elements comprising semiconductor material or other material capable of storing information. Each type of memory may have different configurations. For example, flash memory may be configured in a NAND or a NOR configuration.

The memory can be formed from passive and/or active elements, in any combinations, as would be understood by one of skill in the art.

Multiple memory cells may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple cell groups, where the memory cells that are part of the same cell group share a single bias line, such as a single word line or a single bit line, and are accessed or biased as a group.

A plurality of memory cells that form the memory cell structure 442 of a memory die may be located within and/or over a substrate. The substrate may be a wafer over, in which the layer of the memory cells are formed, or it may be a carrier substrate, which is attached to the memory cells after they are formed.

Memory cells that form the memory cell structure 442, or at least a portion of the memory cell structure 442, may be arranged in two dimensions or in three dimensions in a two-dimensional (2D) of 3D memory cell structure.

Read Threshold Management Optimization

In order to maintain updated read thresholds, a controller may need to run a background process, which will periodically estimate and tune the optimal read thresholds per TT/TRT group.

Read threshold calibration can be conducted through a process of performing a number of senses and then sequentially calculating the Syndrome Weight (SW) as an estimate of the BER according to different hypotheses related to that number of senses. This process may be referred to as a BER Estimation Scan (BES).

Alternately, one can search for valleys in the Cell Voltage Distribution (CVD), measuring the difference of conducting cells between different voltage points.

Figure 6:
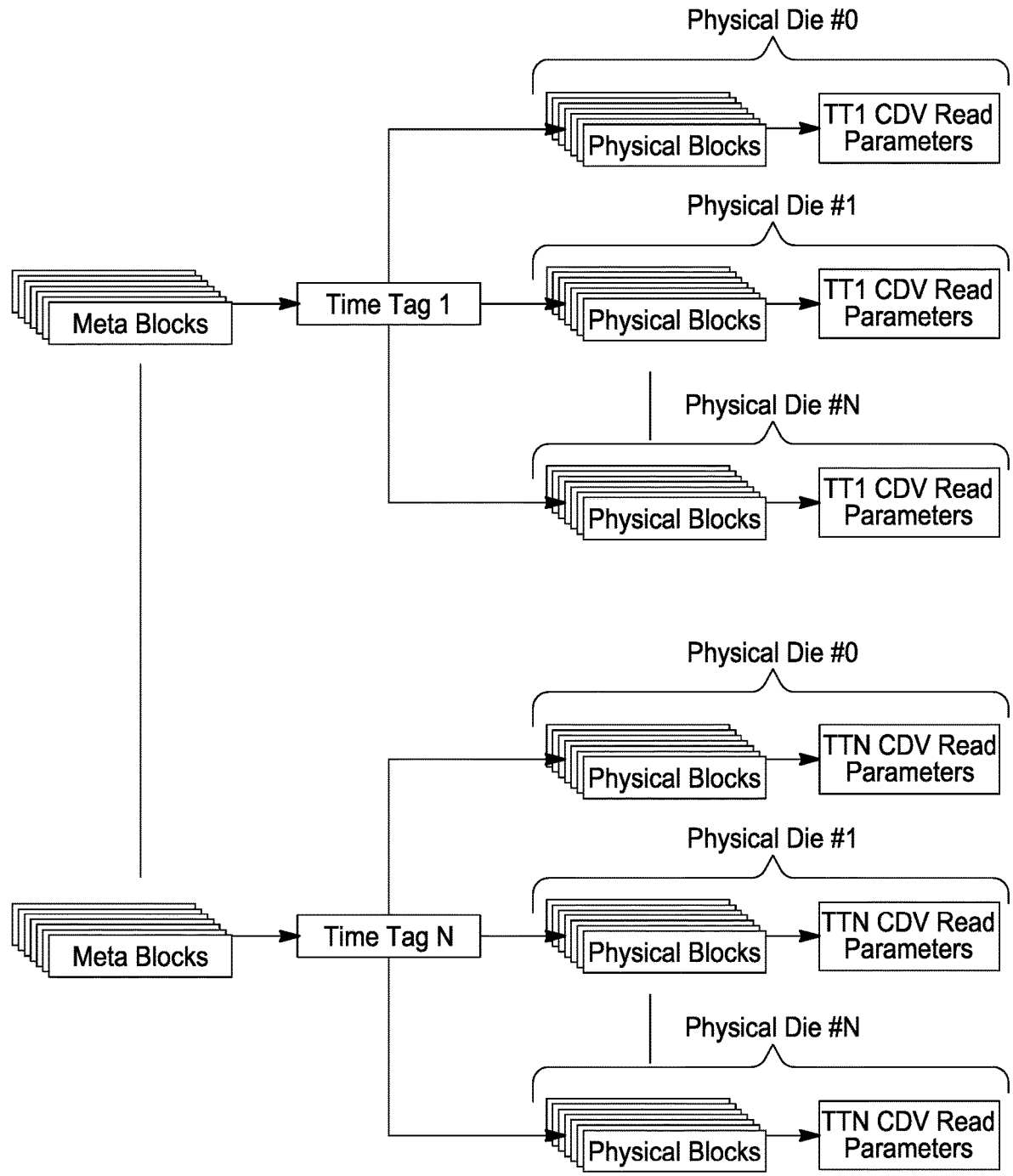
FIG. 6 illustrates a related art TT/TRT parameter deployment scheme.

According to the related art, time and temperature tags (TT and TRT) are managed for each die individually, with the assumption that each die behaves differently. FIG. 6 illustrates a related art TT and/or TRT parameter deployment scheme. As shown in FIG. 6, each time tag, for example, is associated with a set of dies. Read parameters are determined and stored for each die individually, even for different dies associated with the same TT and/or TRT When a flash device operates with a small number of dies, this solution may be acceptable. However, when many dies are used by the same controller (e.g. up to 64 in modern devices) the need to perform read threshold calibration for each die separately and to maintain separately the storage of these parameters creates a large overhead.

Thus, one or more example embodiments provide a method in which dies that show similar behavior are grouped together so that read thresholds acquired for one die can be used for the other dies in the same group. If outlier dies are found, they may be singled out and treated separately.

As discussed, according to a related art method, read thresholds are adjusted separately for each die, and a TT/TRT update is triggered either periodically, at some predefined elapsed time, or triggered by a high BER indication.

Once triggered, a background process chooses a single representative WL or page from each TT/TRT group, or a small sample set from each TT/TRT group, that is calibrated and estimates the optimal read thresholds of the representative WL/page, which serve as the read thresholds that will be used for reading the WLs/pages of the TT/TRT group. The results of the read threshold calibration may be combined together with past read thresholds to smooth the results.

Figure 7:
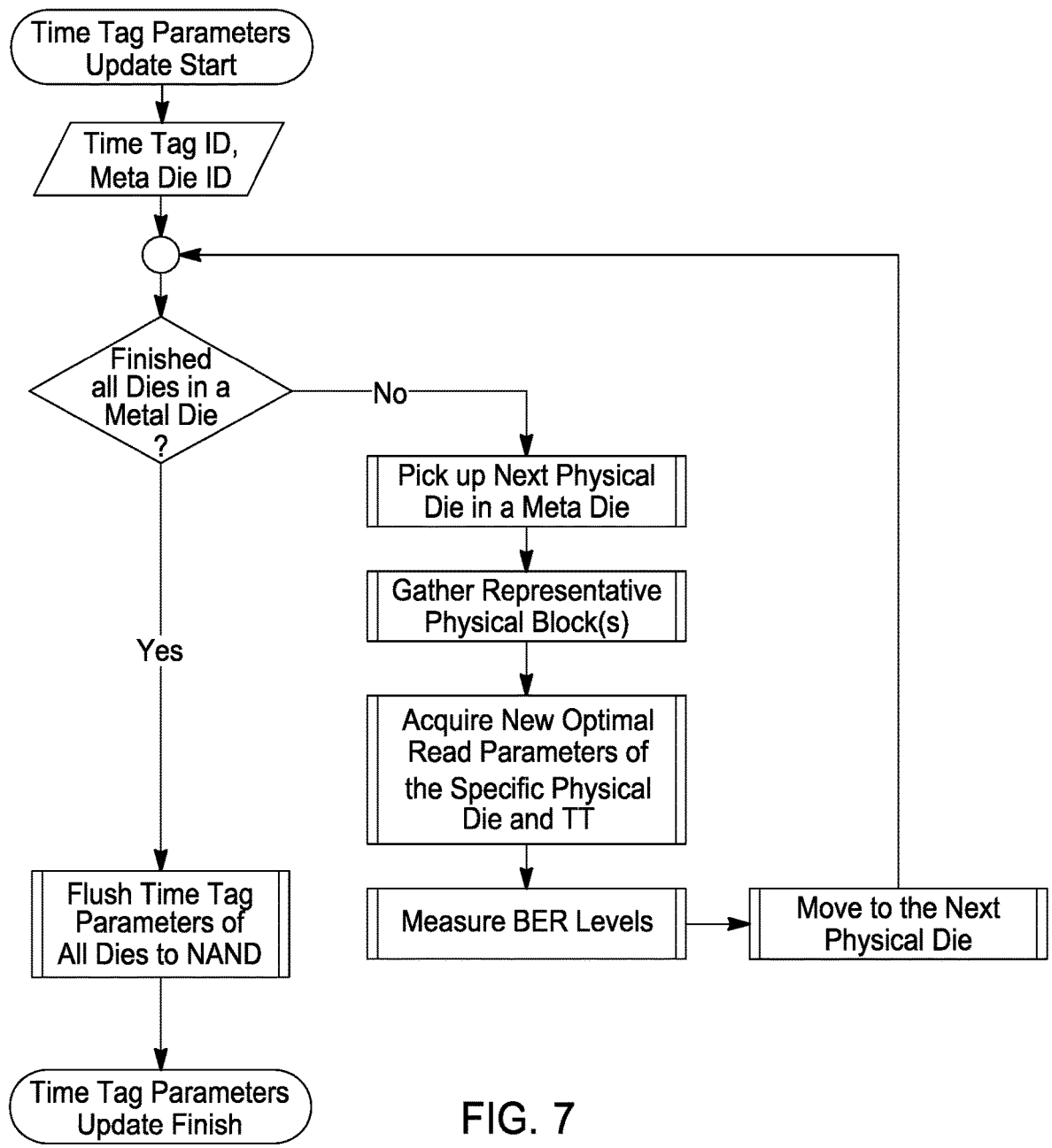
FIG. 7 illustrates a time tag update flow according to a related art method.

The estimation of optimal read thresholds of the representative WL/page may be done using any of various algorithms, such as cell voltage distribution (CVD) Tracking, BES, Valley Search etc. Each of these read threshold estimation methods may incur a relatively high latency penalty, as each requires the performance of multiple reads. The number of reads used to calibrate a page may be at least five, in order to cover a voltage range. FIG. 7 illustrates a time tag update flow according to a related art method. FIG.

7 illustrates a method using time tag parameters, though, alternately, any of a variety of other parameters may be used.

One or more current example embodiments describe a method in which parameters of several dies within one package are grouped together. The method is based on statistical analysis of the performance of each of the dies in the group. Outlier detection is applied to address those dies that do not fit with the group parameters.

While dies have distinct properties, in a vast majority of instances and for most use cases, using a single set (or a minimal number of sets) of parameters works sufficiently well for all the dies in a package. This allows a significant reduction in the number of read threshold calibration operations and allows for a more frequent calibration of the unified read thresholds.

A package may contain one or more outlier dies, and in this case, the outlier die or dies are identified, and a parameter set is maintained specifically for each such outlier die.

Figure 8A:
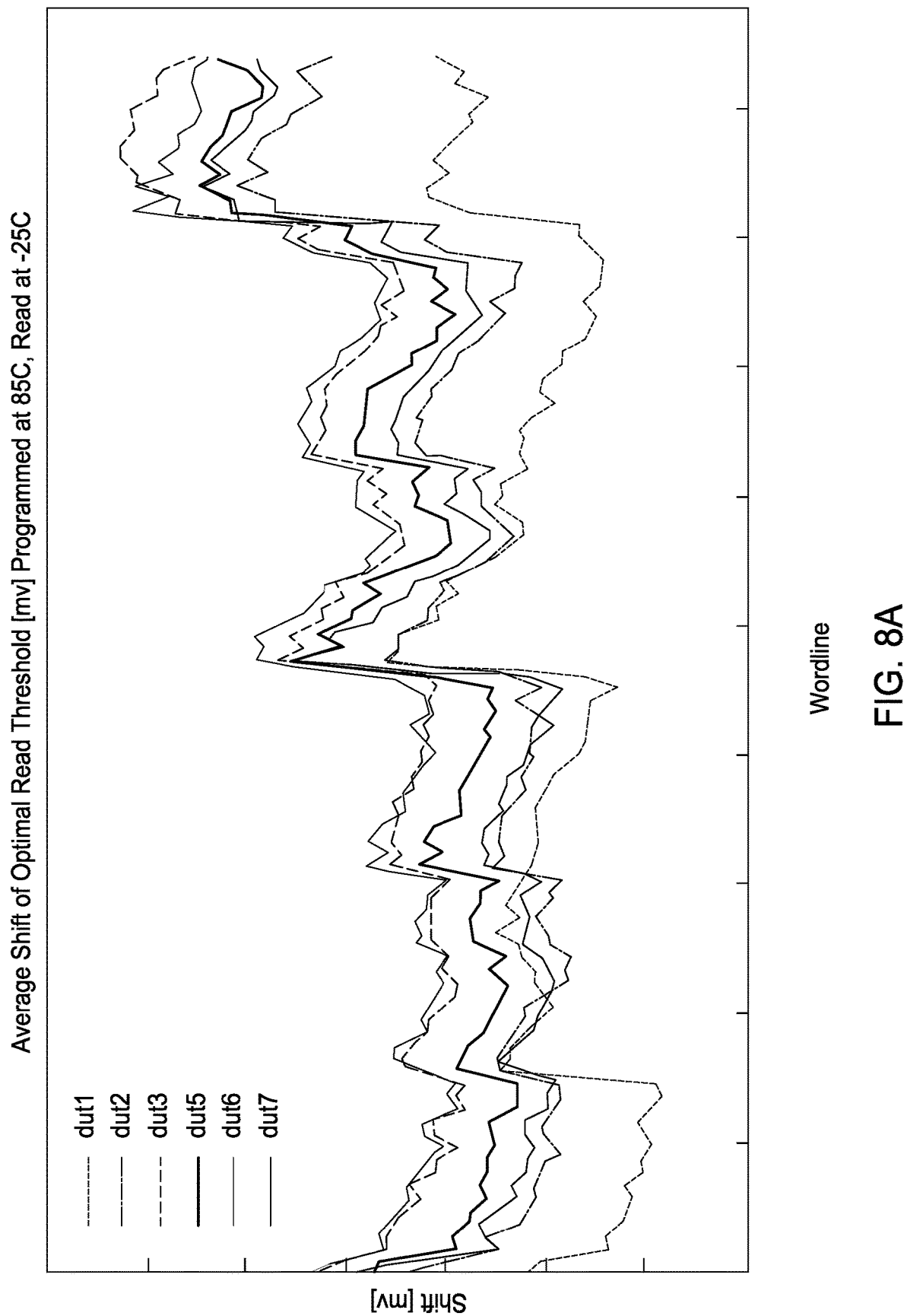
FIGS. 8A and 8B illustrate an example of a comparison of average read thresholds of six different dies under cross-temp conditions.
Figure 8B:
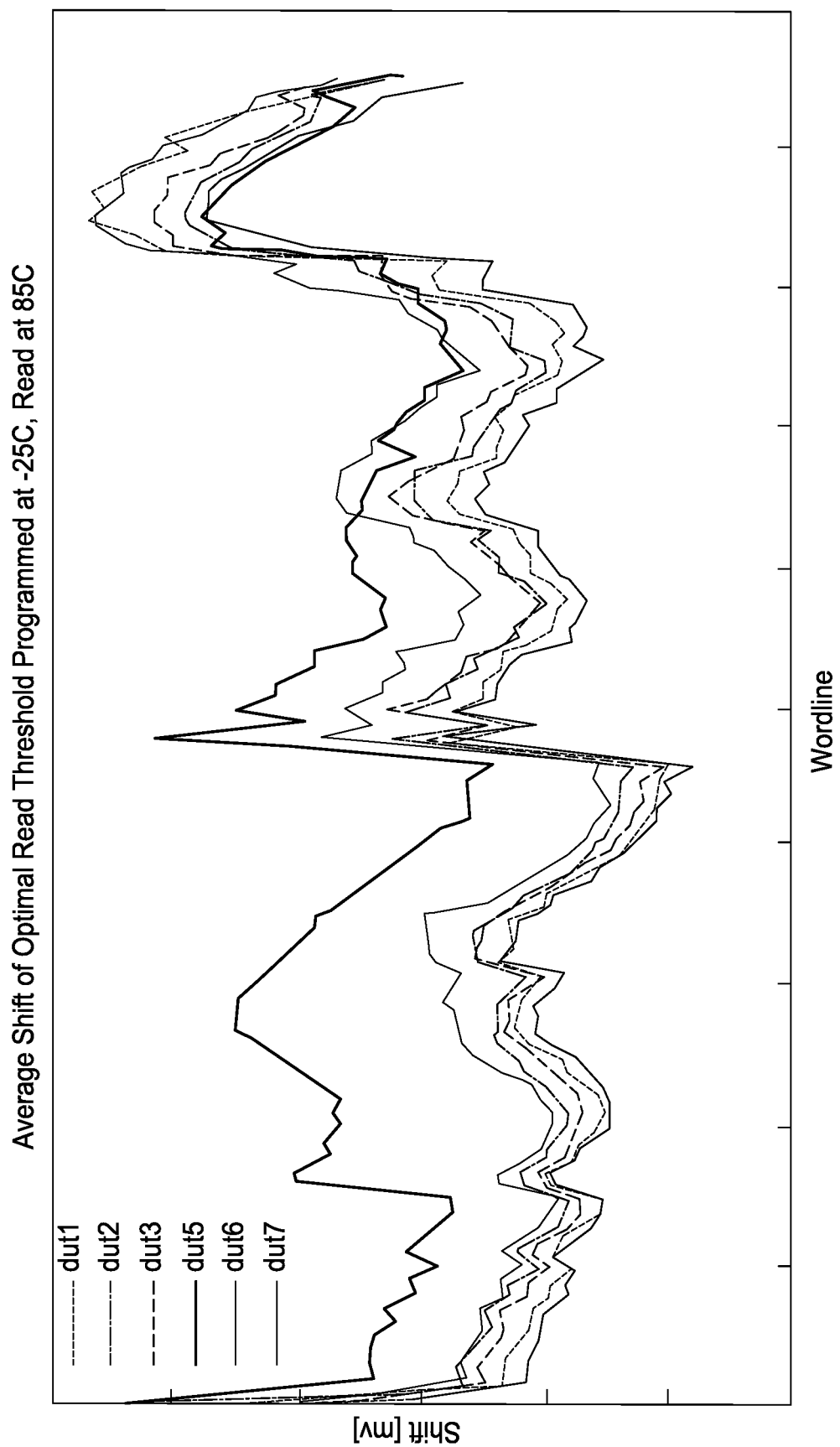

An example of a comparison of average read thresholds of six different dies under cross-temp conditions is shown in FIGS. 8A and 8B. These figures show the average shift of the optimal read threshold for dies in which the data was written at 85° C. and read at −25° C. (FIG. 8A), and for dies in which the data was written at −25° C. and read at 85° C. (FIG. 8B).

As shown in each of these FIGS. 8A and 8B, one of the dies, "dut1," behaves differently than the other five dies. This corroborates an assumption that identifying one or more dies as outliers, while keeping a common read threshold for the majority of dies in the package, is plausible.

According to an example embodiment, outlier dies are detected, and a separate set of parameters is determined for each outlier die. Multiple outlier dies may be detected and, at worst, each of the dies in a package is determined to be an outlier die and each die has its own set of parameters—reducing the system to that of the related art.

Figure 9:
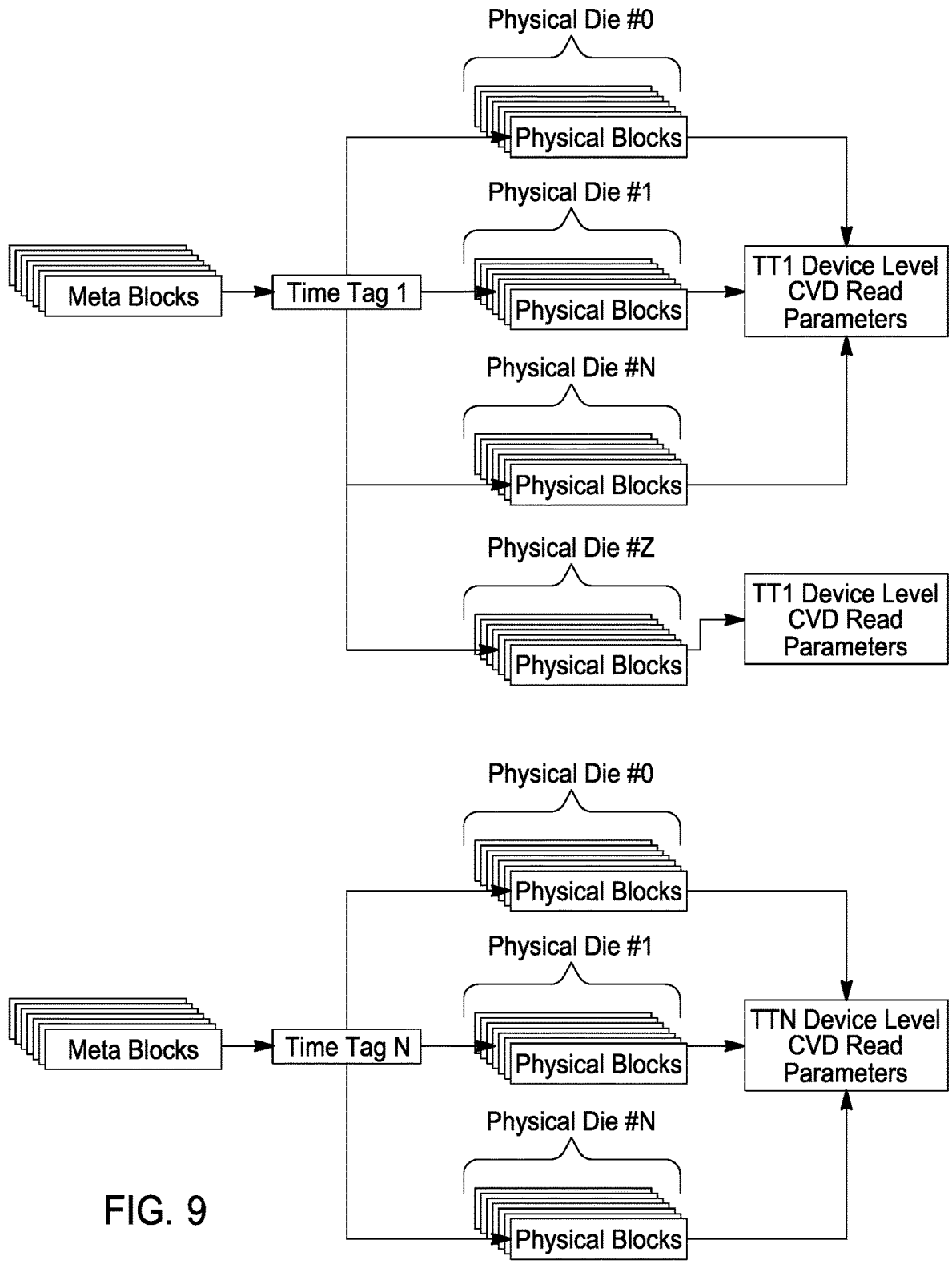
FIG. 9 illustrates a TT/TRT parameter deployment scheme according to an example embodiment.

FIG. 9 illustrates a TT/TRT parameter deployment scheme according to an example embodiment. This may be based on averaging among the dies in a consecutive order, such that representatives from all the dies are eventually averaged into the compounded parameters. Alternately, several representative dies may be selected as candidates for a read parameter update. Such a selection may be based on production of BER figures to see that the BER is within a certain level on these representative dies.

Figure 10:
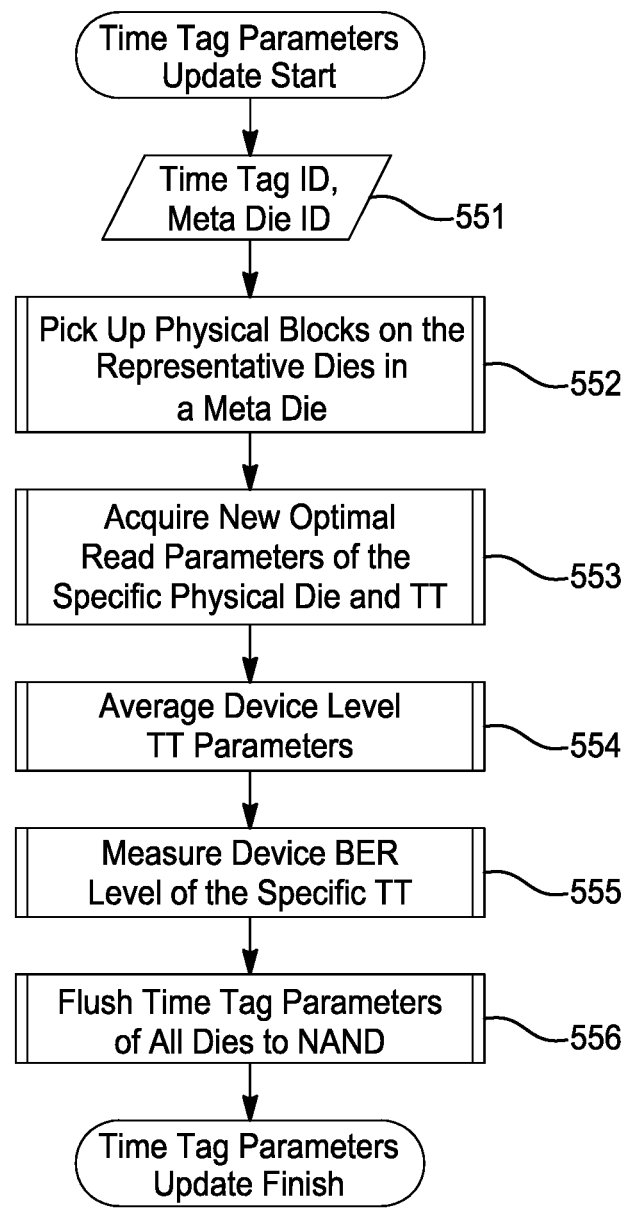
FIG. 10 illustrates a TT/TRT parameter update flow according to an example embodiment.

FIG. 10 illustrates a TT/TRT parameter update flow according to an example embodiment. This is a method by which averaging may be performed. One or more physical blocks are selected, optimal read parameters are determined for these dies, and then an average of these parameters is determined, such that they are sufficient for all the dies in the group. The parameters may then be updated after some amount of time has elapsed (e.g. minutes or hours) or when some condition has changed (e.g. based on a sensing of an external temperature). Accordingly, rather than each die being treated separately, samples are taken, and they are averaged together. As shown, a method according to this example embodiment includes identifying the time tag and meta die of the representative dies (551); identifying physical blocks on the representative dies—i.e. identifying representative blocks of each die (552); acquiring optimal read parameters of the specific physical dies and TT/TRT (553) [how is this performed?; averaging device-level TT/TRT parameters of the specific physical dies (554); measuring device BER levels of the specific TT/TRT (555); and storing/flushing time and temperature tag parameters of all of the dies to the NAND (556). The meta die is a group of physical dies that are logically concatenated to create a larger structure to increase performance by parallelism.

Outlier dies may be detected by monitoring the BER levels or the block relocation rate per die. A check for abnormal BER rates per die or block relocation rates per die may be performed after some time has elapsed as a part of background operation management. Once a die has been detected as showing abnormal results, its parameters may be separated from the other dies.

Figure 11:
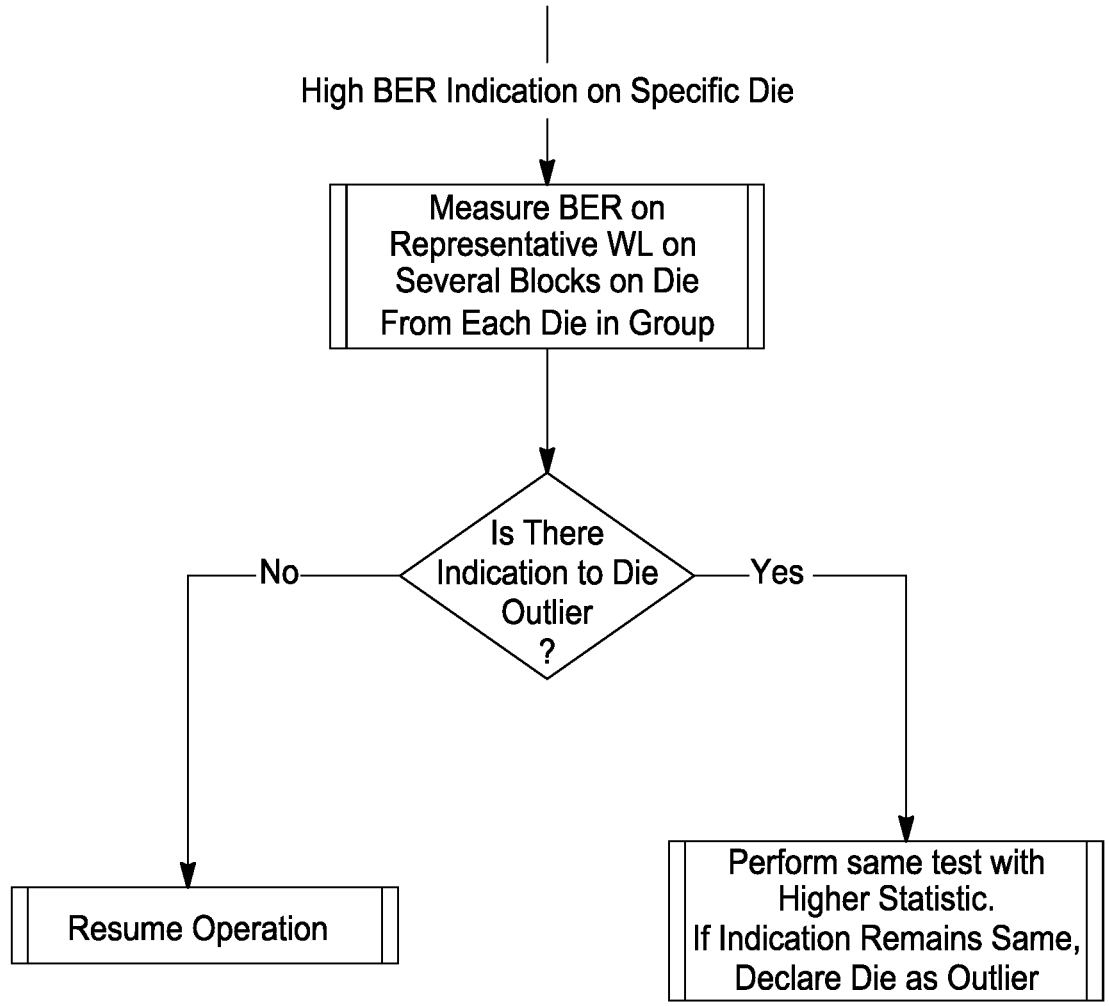
FIG. 11 illustrates a method of identifying an outlier die based on a determination of a high BER indication for a specific die, according to an example embodiment.

FIG. 11 illustrates a method of identifying an outlier die based on a determination of a high BER indication for a specific die, according to an example embodiment. As shown, according to this example, the method is performed based on a determination of a high BER indication for a specific die. Alternately, the method may be performed based on a determination of a high block relocation rate or other identifier of a die having a high BER. If the BER level of a block is high for a period of time, the block is relocated. Thus, a high relocation rate is also an indication that there is a problem. The block relocation rate may be recorded per die.

The determination of a high BER or a high block relocation rate may include a comparison of a measured BER or block relocation rate against an overall BER or block relocation rate or against a predetermined statistic. For example, if 50 BER measurements are collected for each die, the mean BER and 1 sigma BER may be compared among all the dies. If the mean BER of a certain die is more than 2 sigma away from the mean of the other dies, it may be identified as a suspected outlier. In a second stage, a larger statistic may be gathered, perhaps 200 BER measurements. If again the die shows abnormal behavior, it can be declared to be an outlier.

As shown, the method of FIG. 11 includes measuring the BER on representative WLs on several blocks on a die from each die in the group (601). If there is no indication that there is an outlier die (602—No), normal operation is resumed (603). If there is an indication that there is an outlier die (602—Yes), the measurements are performed again and compared with a higher statistic (604), with the result that, if the indication remains the same, the die is declared to be an outlier die. The method of FIG. 11 may alternately be performed using measurements of the block relocation rate rather than the BER.

In some cases, several groups of dies from different sources may be present in a single package, leading to systematic differences among the parameters of dies belonging to the different groups. For example, dies from two different trims can be placed in the same package, mainly in engineering samples (ES)/preliminary die material. In such a case, a single package may include dies from different trims having different sets of parameters due to the methods by which the dies were produced or sourced. These dies from different trims, or having different parameters for any of a variety of other reasons, may be divided into groups and treated distinctively in accordance therewith. This would optimize the parameters such that no one set fits all (as there are systematic differences among the groups) but also that not all dies are treated as outlier dies. Accordingly, some resources are saved.

The determination of die groups may be based on predefined settings such as reading the trim version from the USERROM upon boot and defining the corresponding die group or groups.

However, dies may also be grouped according to other settings, such as their physical locations (sometimes dies controlled by the same controller are not all placed in the same physical location—for example in large servers).

Figure 12:
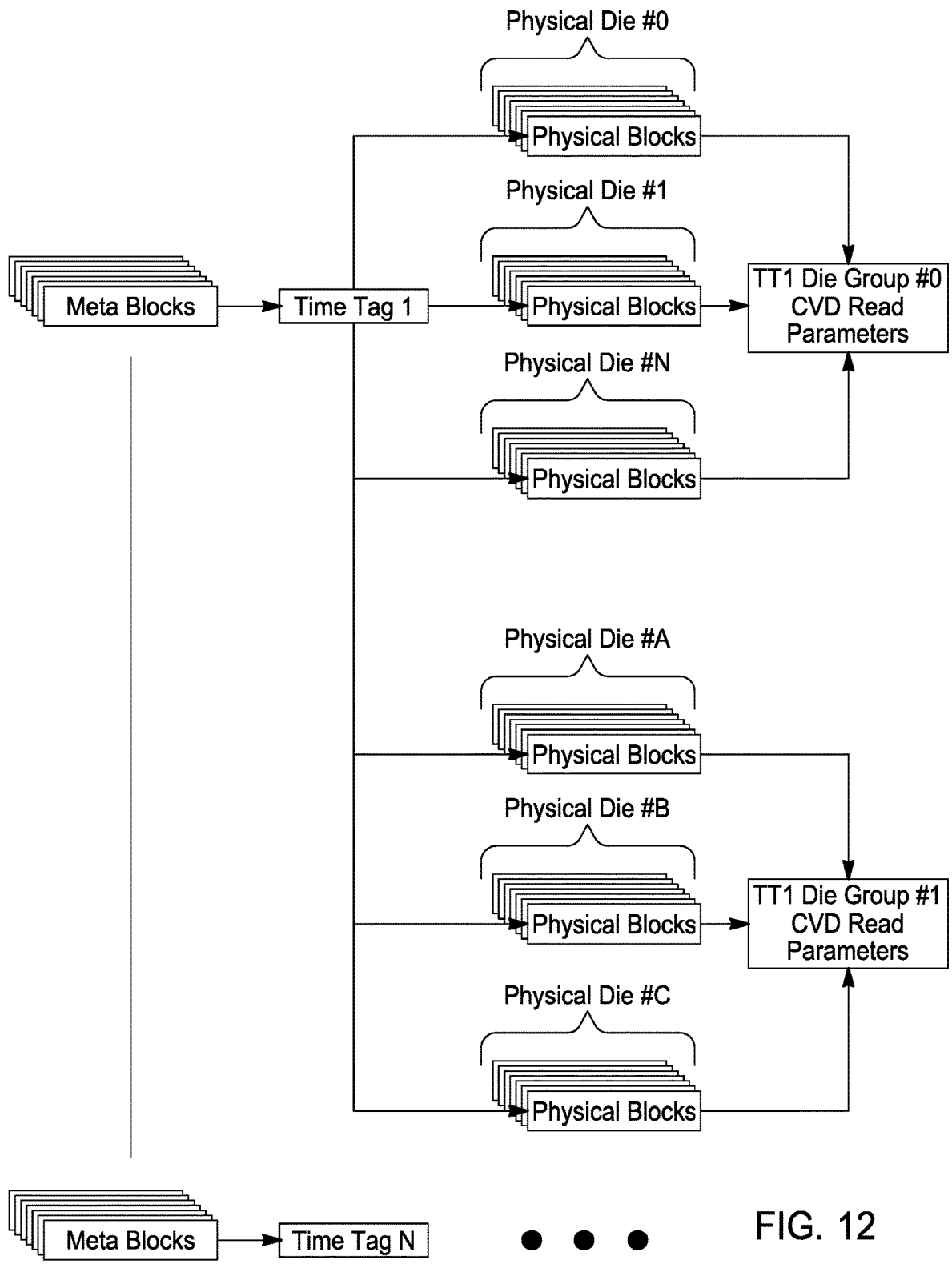
FIG. 12 illustrates a deployment scheme including multiple die groups, according to an example embodiment.

A die group may be indicated explicitly during start up by some procedure that can alter the die group indication. For example, it may be indicated that dies that belong to the same Flash Interface Module (FIM) are all grouped together, there the FIM is an interface in the controller that communicates with a group of dies. FIG. 12 illustrates a deployment scheme including multiple die groups, according to an example embodiment. As shown in FIG. 12, physical dies are divided into multiple groups, where each group is treated independently from each of the other groups, with distinct parameters.

Fast Read Threshold Calibration of Multiple Dies in Parallel

According to one or more of the example embodiments described above, in which dies are grouped together, the process of threshold calibration may still influence system performance because the updates are made periodically and, upon changes in temperature, this measurement must be performed on many groups and for each group, on all the dies that are part of it.

Future generations of NAND are planned to have a logic near the array component (e.g. the Circuit Bonded Array (CBA)) which may allow for both transfer of data between dies, and for greater calculation power at each die, thus enabling read threshold calibration on a local level.

Thus, according to one or more example embodiments, a method is provided to perform parallel operations, which can be orchestrated either by the controller or by inter-die communication, leveraging the new possible computational power and communication layers.

According to the related art, read threshold calibration may be performed on a single logical page or flash memory unit (FMU) on a single die, and the results may be used to decode the data for that specific location, or to infer read thresholds for larger groups of pages using tagging. As discussed above, thresholds for a small number of representatives may be used for several blocks that are written at similar times and under similar conditions.

Read threshold calibration may be performed on all dies separately, calibrating the entire page for each die.

Alternately, zoning schemes are sometimes used in which the WL are separated into multiple zones, and either a different representative is used for each zone, or a single representative is used, and a correction term is added for each zone.

However, according to any of these schemes, the calibration process is either done on one representative at a time (in BES) or in parallel with respect to several dies, but in which each one measured is shifted locally. These schemes are thus time-consuming.

As discussed above, it is noted that TT/TRT can be grouped, with distinctions between grouped dies and outlier dies. According to one or more example embodiments then, such a grouping scheme may be used in combination with a scheme in which the read thresholds may be jointly measured—with a small part of the measurement being performed on each die and the results aggregated to a single set of read thresholds.

One or more example embodiments may provide a method of calibrating read thresholds on several dies in parallel, using a mechanism that allows for a sharing among the dies of the operations for obtaining the read thresholds. A system according to one or more example embodiments may be implemented either using a memory-based read threshold calibration method or employing a logic layer on CBA to acquire the read thresholds and communicate the result to the controller within the memory itself or within the CBA.

In order to maintain desired system performance, a high decoding rate must be achieved. However as the BER increases, decoding latency grows and performance lags. Example reasons for BER increases are shifts in and widening of in the cell voltage distribution due to changes in temperature between write and read (Xtemp) or to Data Retention (DR).

As discussed above, dies have distinct properties, and in a vast majority of instances, and for most use cases, using a single set (or a minimal number of sets) of parameters works sufficiently well for all the dies in a package. This allows a significant reduction in the number of read threshold calibration operations and allows a more frequent calibration of the unified read thresholds.

In case a package does contain one or more outlier dies, these may be identified and a parameter set may be held specifically for each such outlier die, as discussed above.

Thus, a further optimization utilizes the fact the TRT can be grouped over many dies to parallelize the read threshold calibration process and speed it up. Therefore, the calibration process may be spread among the dies in a process by which each die may perform a single calibration operation, and the results may be consolidated into a full set of calibrated thresholds.

According to one or more example embodiments, this approach may provide a speedup factor of 15 for QLC dies.

Figure 13:
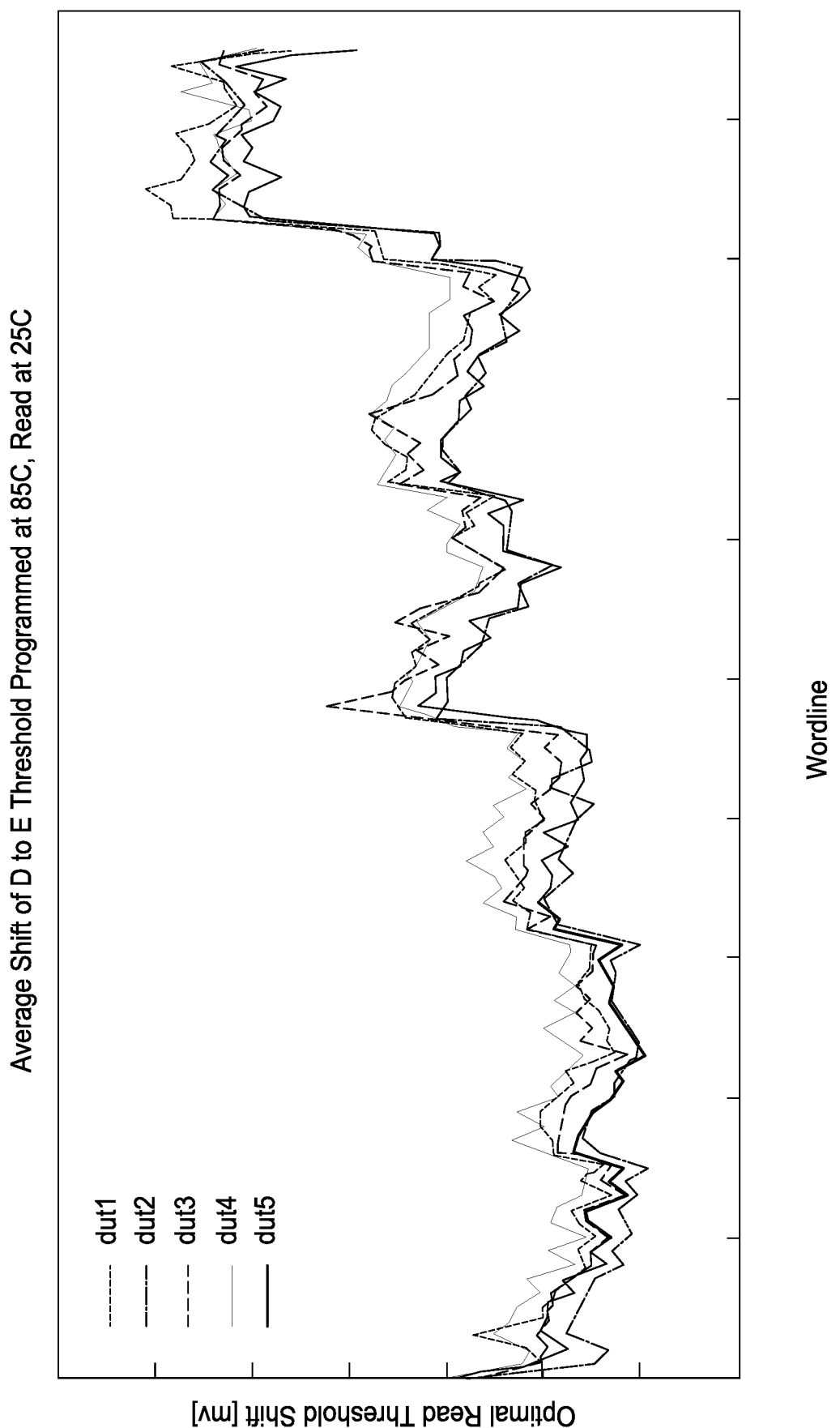
FIG. 13 is a graph illustrating an average shift of a read threshold D to E (as an example) per WL over five dies, according to an example embodiment, under Xtemp conditions.

FIG. 13 is a graph illustrating an average shift of a read threshold D to E (as an example) per WL over five dies, according to an example embodiment, under Xtemp conditions. The figure shows a case in which the data was written at 85° C. and read at −25° C. FIG. 13 illustrates that the optimal read threshold is similar across the dies.

While, potentially, there may be outlier dies that behave differently than other dies, as discussed above, these outlier dies may be marked and calibrated separately from the die group(s).

FIG. 13 shows the correlation between dies which enables the use of one die to calibrate the thresholds of the other dies, combining the results and shortening the overall calibration time.

Per-state consolidation—According to one example embodiment, NAND-based methods may be used that calibrate a single threshold at a time for a logical page.

One such method is a valley search in which a minima on the CVD histogram is identified that roughly corresponds to the BER minima. Measuring the valleys in the CVD is a relativity simple operation, and may be performed on a die basis in which the host sends a command, and the die performs the measurements and returns the results. In other words, firmware sends a command to calibrate a read threshold and the memory returns the read threshold. Now, according to an example embodiment, this operation may be performed across different dies, where each die calibrates does a different threshold at the same time, so that the maximum number of thresholds that may be calibrated at the same time is the number of different dies.

Alternately, the 0/1 ratio may be measured, and the point that is closest to the expected state ratio (assuming scrambling and roughly equal state size) may be found. This is also possible on the memory level.

According to this example embodiment, either of these methods, or any other method in which a single threshold is calibrated for a logical page at a time, can be implemented.

Therefore, a simultaneous measurement can be taken on many dies, each of them sensing a different threshold, returning the results to the controller to be consolidated and used for the die group.

Figure 14:
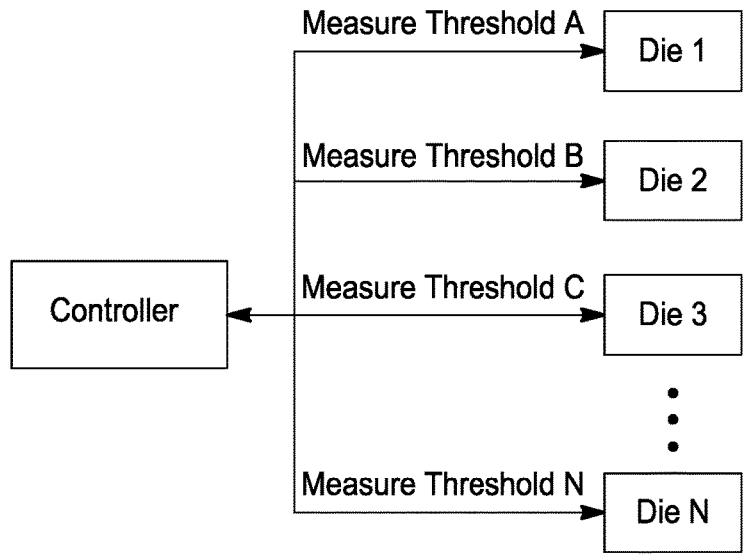
FIG. 14 illustrates such a parallel NAND-based threshold calibration scheme, according to an example embodiment.

FIG. 14 illustrates such a parallel NAND-based threshold calibration scheme, according to an example embodiment. As noted above, according to this example embodiment, the threshold calibration process may be sped-up by a factor of the number of thresholds simultaneously sensed–$2^{BPC}$.

Logical page based consolidation—According to an example embodiment, ECC-based methods may be used that calibrate per logical state, rather than per threshold. This method may be referred to as BES, and is done within ECC.

Related art ECC-based methods call for a read of a full ECC word, and thus must be performed on all the states of the logical page. However, it is possible to parallelize among the logical pages. In such a case, each page is sampled from a different die and consolidated into one set of read thresholds.

Figure 15:
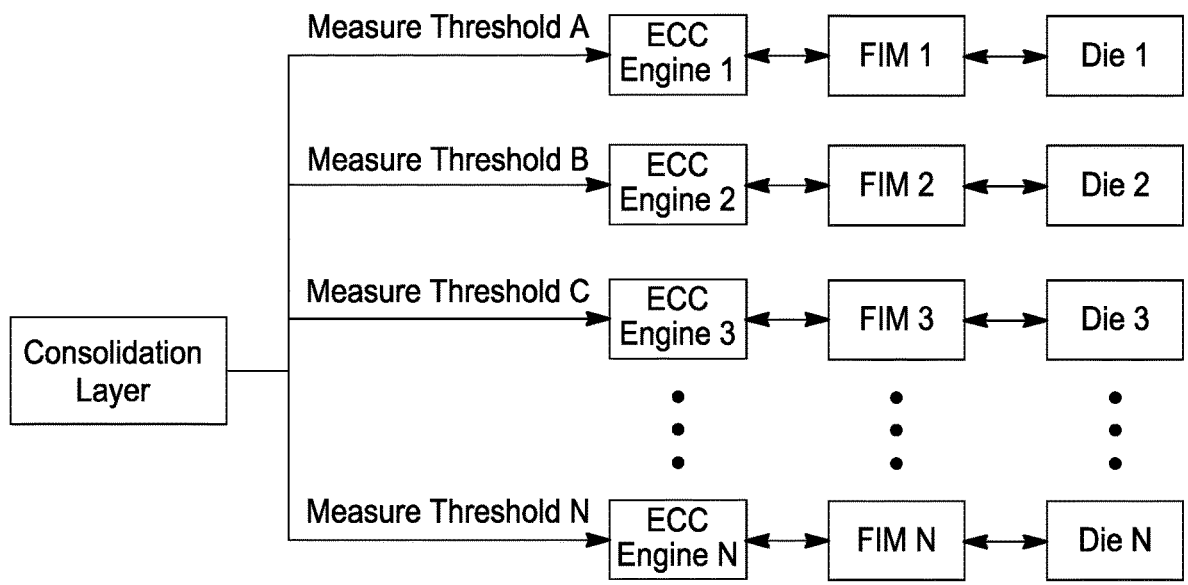
FIG. 15 illustrates a scheme of parallel ECC-based calibration according to an example embodiment.

According to a more significant parallelization method, different FIMs and different ECC engines may be used to allow for even parallel transfer and parallel threshold calculation, as shown in FIG. 15. FIG. 15 illustrates a scheme of parallel ECC-based calibration according to an example embodiment.

According to this example, there may be parallelization at the level of the logical page—e.g. lower page (on die 1), middle page (on die 2), etc. Though this requires the use of multiple ECC engines. The results from the multiple ECC engines may be consolidated by the FW or a dedicated hardware logic. This example embodiment may be particularly useful when a controller employs a pool of decoders (PoD) architecture including several LDPC decoders that can perform threshold calibration simultaneously.

Depending on system performance and architecture, the amount of parallelization may change, i.e. a system with a large pool of decoders may be able to process several die groups in parallel, as systems with a lower count of ECC engines may process a single group in more than one execution step.

Die inter-communication—According to an example embodiment, a method may be used in which some of the work of calibration is offloaded to the dies themselves—the calibration can be performed within a die itself, using dedicated logic ECC in the controller, or using another logic die/CbA/CuA, and the dies can communicate with each other, effectively bypassing the controller. The CBAs or ECCs of the dies can communicate with each other in a method in which the parameters themselves are stored and updated on the dies themselves.

As CBA and similar methods are implemented, thus allowing for easier and cheaper embedding of logic on the dies, future NAND dies will have room for more and more logic. Such logic embedding may allow for more work to be offloaded from the controller onto the dies themselves. According to an example embodiment, CVD and/or ECC-based methods may be performed by the dies themselves which can communicate either by direct die-to-die media or by using a common media (e.g. a TDM bus).

Given such communication abilities, a controller's role in group management may be reduced to grouping dies together, defining update policy (e.g. defining which threshold is calibrated by which die, the time interval between updates, and the preferred read threshold calibration update algorithm), and in some cases, triggering an urgent update.

In this example scheme, each die performs a calibration on a different threshold\logical page and shares the results with the other dies, each holding a consolidated table for its own internal use.

Figure 16:
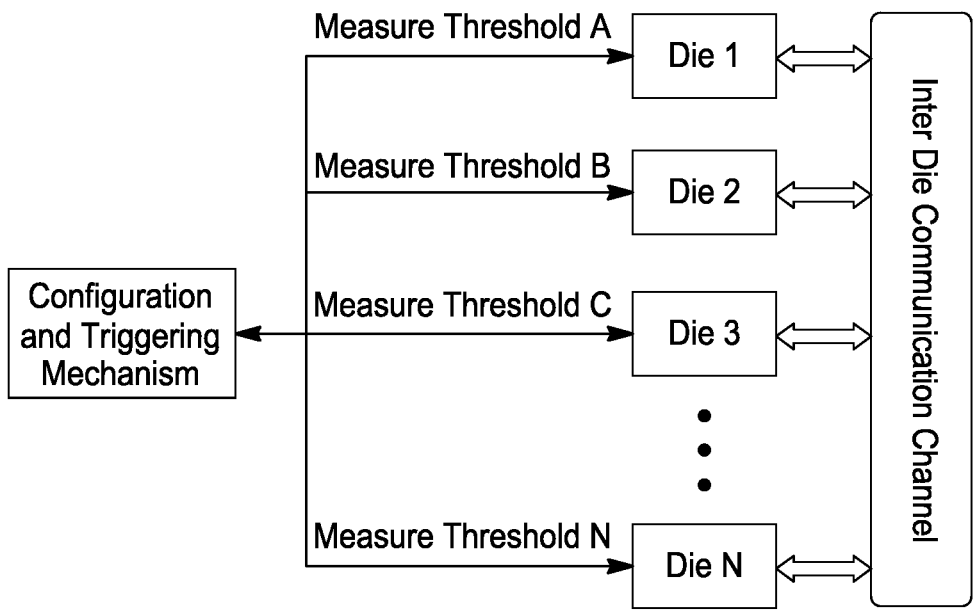
FIG. 16 illustrates a scheme of an inter connect layer responsible for management of read threshold calibration, according to an example embodiment.

FIG. 16 illustrates a scheme of an inter connect layer responsible for management of read threshold calibration, according to an example embodiment. In a synchronous measurement scheme, measurement may be triggered by the controller, by a master die, or by an external logic or clock. In an asynchronous measurement scheme, each die can independently determine when to perform the measurements. Alternately, a hybrid scheme may be used in which there is a trigger for the dies to perform the measurement according to the synchronous measurement scheme, but the measurements themselves may be performed by the die when there is a vacancy in its queue. If die workload is high, and no such vacancy is found, the die will wait until the end of the time interval in which case it will stop the foreground operation and perform the background operation. Then, updated values are shared among the dies in the group within the determined interval.

It should be noted that with asynchronous implementation, the time gap between triggers and the time interval does not have to be the same—i.e. the thresholds may be sampled once an hour (the trigger interval), but, in order for all measurements to be done at similar conditions, the time interval may be set to one minute, so that once an hour, all the thresholds will be sampled and updated within one minute.

Figure 17:
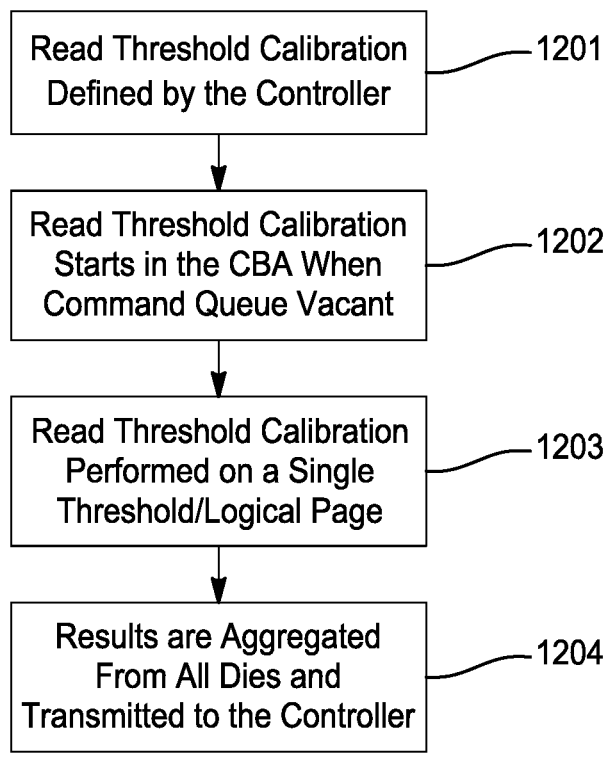
FIG. 17 illustrates a method of read threshold calibration on a CBA die inter connect later according to an example embodiment.

FIG. 17 illustrates a method of read threshold calibration on a CBA die inter connect later according to an example embodiment. According to this method, in addition to the speedup, the controller does not need to manage the TRTs and the background operations, and vacant time slots are determined on a die-by-die basis. Once the read threshold calibration policy is defined by the controller (1201), the CBA begins the read threshold calibration when the command queue is vacant (1202); the read threshold calibration is performed on a single threshold or logical page (1203); and the results are aggregated from all the dies and transmitted from the CBA to the controller (1204).

According to one or more example embodiments, a method of read threshold calibration may result in less overhead per individual die, and the measurements may be optimized to fit the specific loads of the individual dies.

According to one or more example embodiments described herein an improved system and method are provided for managing read thresholds/parameters for groups of dies, resulting in better read thresholds due to more possible updates happening more often and less overhead due to read threshold/parameter calibration per individual die. This may be of particular utility in conjunction with packages with large numbers of dies.

Various terms are used to refer to particular system components. Different companies may refer to a component by different names—this document does not intend to distinguish between components that differ in name but not function.

Matters of these example embodiments that are obvious to those of ordinary skill in the technical field to which these example embodiments pertain may not be described here in detail.

The example embodiments described herein may be considered in a descriptive sense only and not for purposes of limitation. Descriptions of features or aspects within each example embodiment may be considered as available for other similar features or aspects in other example embodiments.

While example embodiments have been described with reference to the figures, it will be understood by those of ordinary skill in the art that various changes in form and details may be made therein without departing from the spirit and scope as defined by the following claims.

What is claimed is:

1. A method of read threshold management of a non-volatile memory comprising a plurality of physical dies, each of the plurality of physical dies comprising a plurality of physical blocks, the method comprising:
   selecting, based on respective operating parameters of each of the plurality of physical dies, a group of physical dies from among the plurality of physical dies;
   determining respective read parameters of each of the physical dies in the group of physical dies;
   determining a compound read parameter using the respective read parameters determined for each of the physical dies in the group; and
   applying the same determined compound read parameter to each of the physical dies in the group.

2. The method of claim 1, wherein the determining the compound read parameter comprises determining a first read parameter of a first selected physical die, determining a second read parameter of a second selected physical die, and defining the read parameter as an average of at least the first read parameter and the second read parameter.

3. The method of claim 2, further comprising:
   performing read threshold calibration on each of the plurality of physical dies.

4. The method of claim 3, wherein the performing the read threshold calibration comprises calculating a syndrome weight as an estimate of the bit error rate (BER).

5. The method of claim 3, wherein the performing the read threshold calibration comprises performing a valley search.

6. The method of claim 1, wherein the determining the read parameter comprises:
   determining at least one device level parameter of the at least one physical die and determining the read parameter based on the at least one device level parameter.

7. The method of claim 1, wherein the determining the read parameter comprises:
   determining a first device level parameter of a first word line, determining a second device level parameter of a second word line; and
   determining the read parameter based on the first device level parameter and the second device level parameter.

* * * * *